(12) United States Patent
Hwang et al.

(10) Patent No.: US 8,309,448 B2
(45) Date of Patent: Nov. 13, 2012

(54) METHOD FOR FORMING BURIED WORD LINE IN SEMICONDUCTOR DEVICE

(75) Inventors: Sun-Hwan Hwang, Gyeonggi-do (KR); Se-Aug Jang, Gyeonggi-do (KR); Kee-Joon Oh, Gyeonggi-do (KR); Soon-Young Park, Gyeonggi-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 42 days.

(21) Appl. No.: 12/646,478

(22) Filed: Dec. 23, 2009

(65) Prior Publication Data

US 2011/0027988 A1 Feb. 3, 2011

(30) Foreign Application Priority Data

Jul. 31, 2009 (KR) .................. 10-2009-0070990

(51) Int. Cl.
*H01L 21/3205* (2006.01)
*H01L 21/4763* (2006.01)

(52) U.S. Cl. ........ 438/589; 438/658; 438/659; 438/660; 257/E27.084; 257/E21.646; 257/E21.659

(58) Field of Classification Search .................. 439/589, 439/658–660; 257/E27.084, E21.646, E21.659
See application file for complete search history.

(56) References Cited

U.S. PATENT DOCUMENTS

| 6,930,039 | B2* | 8/2005 | Schuele et al. | 438/643 |
| 7,550,302 | B2* | 6/2009 | Wang et al. | 438/3 |
| 7,659,560 | B2* | 2/2010 | Tang et al. | 257/192 |
| 2004/0129670 | A1* | 7/2004 | Kweon et al. | 216/22 |
| 2007/0257372 | A1* | 11/2007 | Tada et al. | 257/763 |
| 2008/0042118 | A1* | 2/2008 | Hayakawa | 257/4 |
| 2009/0029512 | A1* | 1/2009 | Willer et al. | 438/261 |

FOREIGN PATENT DOCUMENTS

| JP | 2001210606 A | * | 8/2001 |
| KR | 100300150 | | 9/2001 |
| KR | 1020060131135 | | 12/2006 |

OTHER PUBLICATIONS

Morita et al. JP 2001210606A, English Translation.*
Notice of Preliminary Rejection issued from Korean Intellectual Property Office on Mar. 18, 2011.

* cited by examiner

*Primary Examiner* — Bac Au
(74) *Attorney, Agent, or Firm* — IP&T Group LLP

(57) ABSTRACT

Provided is a method for forming a buried word line in a semiconductor device. The method includes forming a trench by etching a pad layer and a substrate, forming a conductive layer to fill the trench, planarizing the conductive layer until the pad layer is exposed, performing an etch-back process on the planarized conductive layer, and performing an annealing process in an atmosphere of a nitride-based gas after at least one of the forming of the conductive layer, the planarizing of the conductive layer, and the performing of the etch-back process on the planarized conductive layer.

7 Claims, 13 Drawing Sheets

METHOD FOR FORMING BURIED WORD LINE IN SEMICONDUCTOR DEVICE

CROSS-REFERENCE TO RELATED APPLICATIONS

The present application claims priority of Korean Patent Application No. 10-2009-0070990, filed on Jul. 31, 2009, which is incorporated herein by reference in its entirety.

BACKGROUND OF THE INVENTION

The present invention relates to a method for fabricating a semiconductor device, and more particularly, to a method for forming a buried word line in a semiconductor device.

In a fabricating process for a small DRAM such as a 60 nm DRAM, it is essential to form a buried word line in order to increase the integration degree of a transistor in a cell, simplify a fabricating process, and improve a device property such as a current leakage property.

In general, a trench is formed and a word line is buried in the trench to form a buried word line. Such a buried word line forming method according to the related art has several advantages. For example, interference between a bit line and a word line is minimized, the number of stacked films is reduced, and a refresh property is improved by reducing the overall capacitance of cells.

However, the buried word line forming method according to the related art disadvantageously increases a sheet resistance (Rs) of the buried word line if a single layer of a titanium nitride (TiN) layer is used. In order to reduce such an increase of the sheet resistance, a bi-layer of a titanium nitride (TiN) layer and a tungsten (W) layer was used.

However, although the sheet resistance can be reduced by using the bi-layer of a titanium nitride (TiN) layer and a tungsten (W) layer, it causes a gap-fill problem because a width of a buried word line shrinks.

Further, the refresh property can be improved by increasing a depth of an etch-back process for forming a buried word line. However, it also increases the sheet resistance of the buried word line.

FIG. 1 is a graph showing a sheet resistance increase phenomenon that occurs when an etch-back depth is increased or when a bi-layer is used for a buried word line.

Referring to FIG. 1, a first bar 20A shows a sheet resistance when a buried word line is formed using a single layer of a titanium nitride layer and an etch-back depth of 500 Å. As shown, the sheet resistance of the first bar 20A is comparatively large. A second bar 20B shows a sheet resistance when a buried word line is formed using a bi-layer of a titanium nitride layer and a tungsten layer and an etch-back depth of 500 Å. As shown, the sheet resistance of the second bar 20B is reduced compared to the sheet resistance of the first bar 20A. A third bar 20C shows a sheet resistance when a buried word line is formed using a bi-layer of a titanium nitride layer and a tungsten layer and an etch-back depth of 650 Å. As shown, the sheet resistance of the third bar 20C is increased compared to the sheet resistance of the second bar 20B.

SUMMARY OF THE INVENTION

An embodiment of the present invention is directed to providing a method for forming a buried word line in a semiconductor device for reducing a sheet resistance of a buried word line.

An embodiment of the present invention is directed to providing a method for forming a buried word line in a semiconductor device for suppressing the increase of a sheet resistance of a buried word line although an etch-back depth is increased.

In accordance with an aspect of the present invention, there is provided a method for forming a buried word line in a semiconductor device, including forming a trench by etching a pad layer and a substrate, forming a conductive layer to fill the trench, planarizing the conductive layer until the pad layer is exposed, performing an etch back process on the planarized conductive layer, and performing an annealing process in an atmosphere of a nitride-based gas after at least one of the forming of the conductive layer, the planarizing of the conductive layer, and the performing of the etch-back process on the planarized conductive layer.

In accordance with another aspect of the present invention, there is provided a method for forming a buried word line in a semiconductor device, including forming a trench by etching a pad layer and a substrate, forming a conductive layer to fill the trench, planarizing the conductive layer until the pad layer is exposed, performing an etch-back process on the planarized conductive layer, and performing an annealing process in an atmosphere of a nitride-based gas after the forming of the conductive layer, after the planarizing of the conductive layer, and after the performing of the etch-back process on the planarized conductive layer.

In the performing of the annealing process, the nitride gas may be a $NH_3$ gas.

In the performing of the annealing process, the annealing process may be a rapid thermal process (RTP) or a furnace type process.

In the performing of the annealing process, the annealing process may be performed in a temperature range of about 300° C. to 1100° C. at a process pressure range of about 0.001 torr to 1000 torr for a duration of about 1 second to 10000 seconds.

The conductive layer may be a single layer of a titanium nitride layer or a bi-layer of a titanium nitride layer and a tungsten layer.

DESCRIPTION OF SPECIFIC EMBODIMENTS

Figure 1:
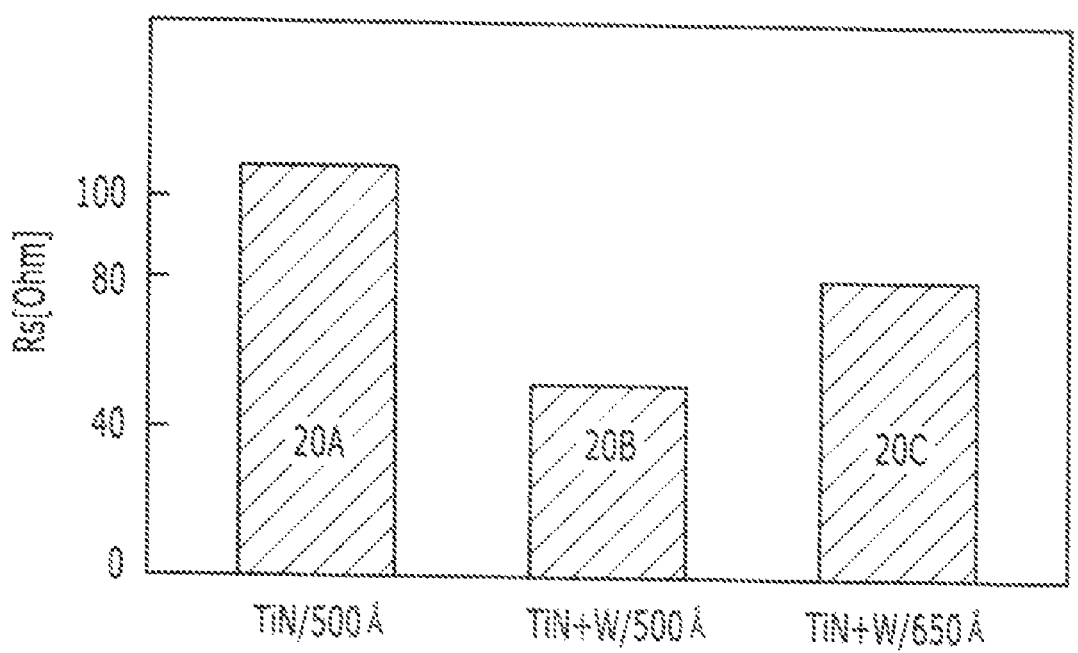
FIG. 1 is a graph showing a sheet resistance increase phenomenon when an etch-back depth of a buried word line is increased and when a bi-layer is used to form a buried word line.

Other objects and advantages of the present invention can be understood by the following description, and become apparent with reference to the embodiments of the present invention.

Referring to the drawings, the illustrated thickness of layers and regions may have been exaggerated to facilitate explanation. When a first layer is referred to as being "on" a second layer or "on" a substrate, it could mean that the first layer is formed directly on the second layer or the substrate, or it could also mean that a third layer may exist between the first layer and the second layer or the substrate. Furthermore, the same or like reference numerals represent the same or like constituent elements, although they appear in different embodiments or drawings of the present invention.

When a buried word line is formed, $TiCl_4$ or TDMAT $[Ti(N(CH_3)_2)_4]$ is used as a source gas for forming a titanium nitride (TiN) layer. In this case, the titanium nitride layer contains a large amount of carbon and chlorine impurities.

Further, $WF_6$ is used as a source gas for forming a tungsten (W) layer. In this case, the tungsten layer contains a large amount of fluorine impurities.

In order to reduce a sheet resistance of a buried word line, it is necessary to reduce the resistivity of a material used to form a buried word line. The resistivity of a titanium nitride layer can be reduced by reducing carbon and chlorine components in the titanium nitride layer. In the case of a tungsten layer, the resistivity of the tungsten layer can be reduced by reducing fluorine components in the tungsten layer.

In embodiments of the present invention, an annealing process is performed in a nitride-based gas atmosphere such as $NH_3$ to reduce impurity components such as carbon, chlorine, and fluorine in a metal layer used as a buried word line.

The annealing process in the nitride-based gas atmosphere may be performed after at least one of several steps in a buried word line forming method. For example, this annealing process with the nitride-based gas atmosphere may be performed after forming a conductive layer, or after planarizing the conductive layer. Further, this annealing process may be performed after etching the planarized conductive layer.

Moreover, the annealing process in a nitride-based gas atmosphere may be performed every time after each of the steps of forming a conductive layer to fill a trench, planarizing the conductive layer, and etching the planarized conductive layer.

FIGS. 2A to 2F are diagrams illustrating a method for forming a buried word line in accordance with a first embodiment of the present invention.

Figure 2A:
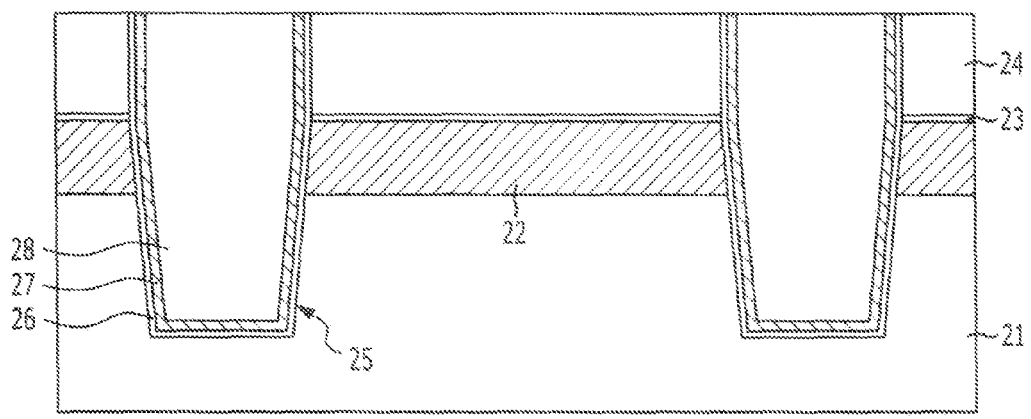
FIGS. 2A to 2F are cross-sectional views illustrating a method for forming a buried word line in accordance with a first embodiment of the present invention.

As shown in FIG. 2A, a pad oxide layer 23 and a pad nitride layer 24 are stacked over a substrate 21. The substrate 21 may be a silicon substrate. Here, an impurity region 22 may be formed by implanting impurities through an ion implantation before forming the pad oxide layer 23. The impurity region 22 becomes a source region and a drain region of a transistor.

Subsequently, a shallow trench isolation (STI) process is performed. That is, the pad nitride layer 24 is etched using a photoresist layer as a device isolation mask (not shown). Then, the photoresist layer is removed, and the substrate 21 is etched with the pad nitride layer 24 acting as an etching barrier. Thus, a first trench 25 is formed using the pad nitride layer 24 as a hard mask. Then, a device isolation layer 28 is formed by gap-filling the first trench 25 with an insulating layer. The device isolation layer 28 may be formed using a flowable oxide layer through a single gap-fill process. Alternatively, the device isolation layer 28 may be formed using a combination of a flowable oxide layer and a deposition oxide layer. The flowable oxide layer may include Spin On Dielectric (SOD) and the deposition oxide layer may include High Density Plasma (HDP) oxide.

Before forming the device isolation layer 28, a sidewall oxide layer 26 may be formed through a wall oxidation process and a liner nitride layer 27 may be formed on the sidewall oxide layer 26.

Figure 2B:
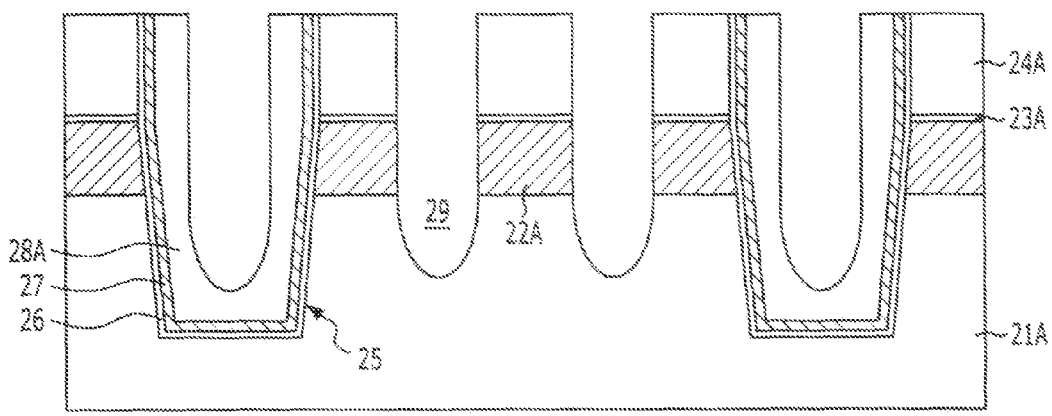

As shown in FIG. 2B, a second trench 29 is formed at a cell region by performing etching using a buried word line mask (not shown). That is, the second trench 29 is formed by continuously etching the substrate 21 and the device isolation layer 28 at a predetermined depth after etching the pad nitride layer 24 and the pad oxide layer 23. Hereinafter, the etched substrate is referred to as "a substrate 21A", the etched device isolation layer is referred to as "a device isolation layer 28A", the etched pad nitride layer is referred to as "a pad nitride layer 24A", and the etched pad oxide layer is referred to as "a pad oxide layer 23A". The second trench 29 isolates the impurity region to form a junction region 22A to be the source region and the drain region.

Figure 2C:
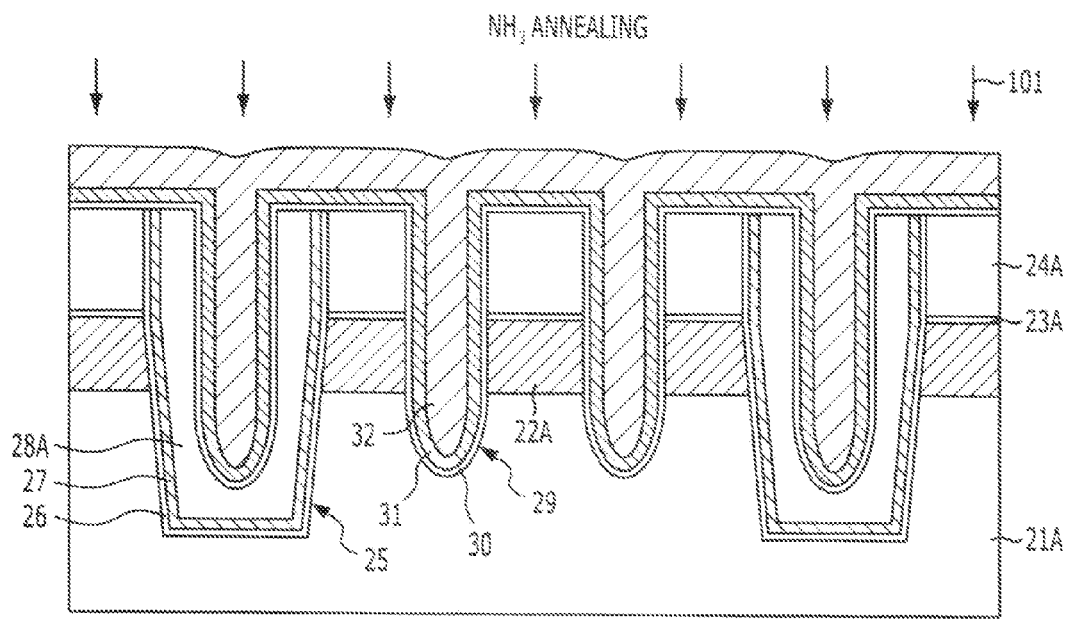

As shown in FIG. 2C, a gate insulating layer 30 is formed over the second trench 29. The gate insulating layer 30 is a gate insulating layer for a transistor in a cell region.

A metal layer is deposited over the gate insulating layer 30 to gap-fill the second trench 29. The metal layer may be formed by thinly depositing a titanium nitride layer 31 to conform to the second trench 29, and then gap-filling the second trench 29 with a tungsten layer 32. Preferably, the titanium nitride layer 31 may be formed at a thickness of about 20 Å to 80 Å.

The titanium nitride layer 31 is deposited using $TiCl_4$ or TDMAT $[Ti(N(CH_3)_2)_4]$ as a source gas. Due to the source gas $TiCl_4$ or TDMAT $[Ti(N(CH_3)_2)_4]$, the titanium nitride layer 31 includes a large amount of carbon or chlorine.

In order to form the tungsten (W) layer 32, $WF_6$ is used as a source gas. Accordingly, the tungsten layer 32 includes a large amount of fluorine.

In order to remove the carbon and chlorine components in the titanium nitride layer 31 and the fluorine components in the tungsten layer 32, an annealing process 101 is performed in an $NH_3$ atmosphere.

Figure 2D:
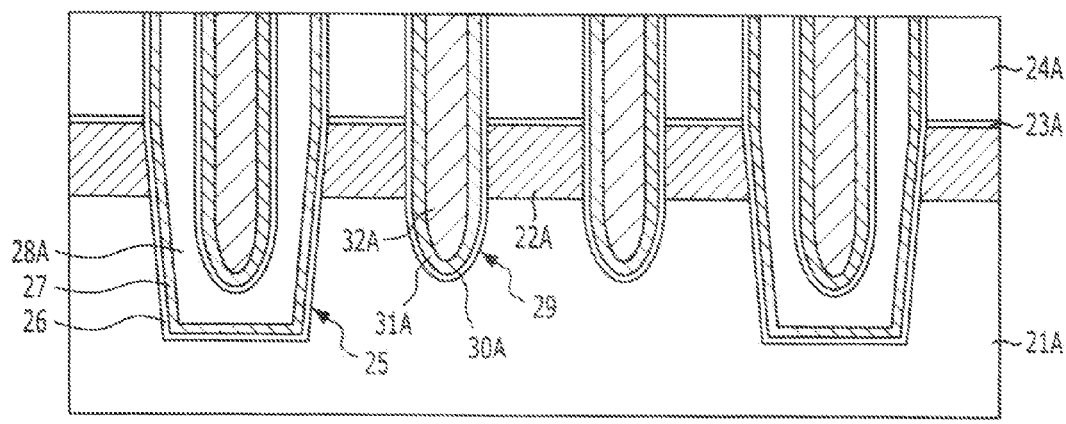

As shown in FIG. 2D, a planarization process is performed on the tungsten layer 32, the titanium nitride layer 31, and the gate insulating layer 30 using a chemical mechanical polishing (CMP) method to expose a surface of the pad nitride layer 24A. By this process, a tungsten layer 32A, a titanium nitride layer 31A, and a gate insulating layer 30A remain in the second trench 29.

Figure 2E:
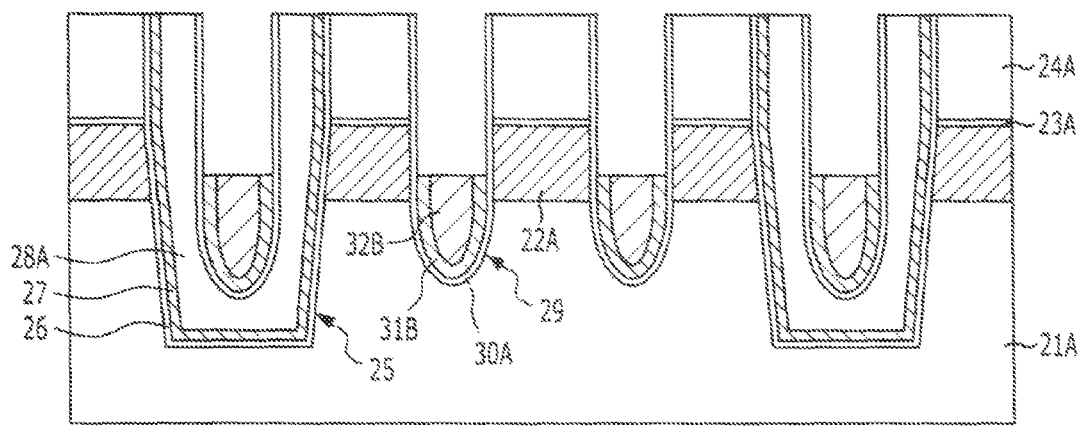

As shown in FIG. 2E, a buried word line is formed by performing an etch-back process to the tungsten layer 32A and the titanium nitride layer 31A. Thus, the buried word line only partially fills the second trench 29. The surface of the buried word line may be lower than a surface of the substrate 21A. The buried word line has a bi-layer structure of a titanium nitride layer 31B and a tungsten layer 32B.

Figure 2F:
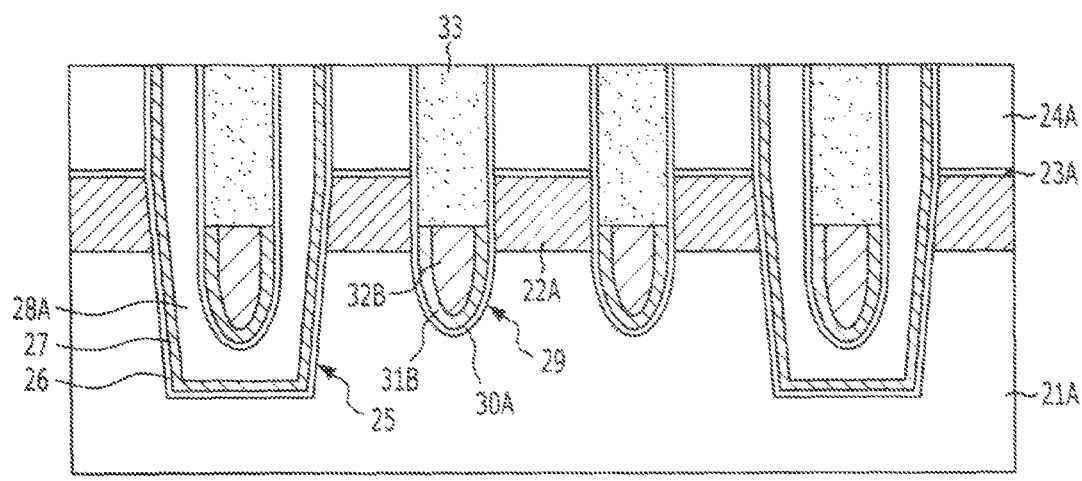

As shown in FIG. 2F, a sealing layer 33 is formed to seal a top of the buried word line. The sealing layer 33 may be one selected from a group consisting of an oxide layer, a nitride layer, and a bi-layer of a nitride layer and an oxide layer. For example, the sealing layer 33 may be formed by thinly depositing a sealing nitride layer and gap-filling the second trench 29 with a sealing oxide layer such as an SOD.

Then, a planarization process is performed on the sealing layer 33 to expose a surface of the pad nitride layer 24A. For example, a CMP or an etch-back may be performed to planarize the sealing layer 33. Preferably, a CMP is performed to improve wafer uniformity and to prevent loss in a lower layer.

FIGS. 3A to 3F are diagrams illustrating a method for forming a buried word line in accordance with a second embodiment of the present invention.

Figure 3A:
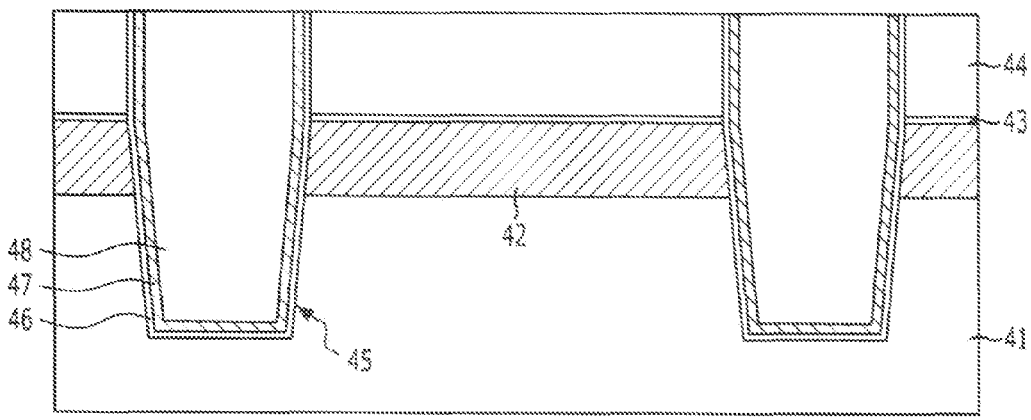
FIGS. 3A to 3F are cross-sectional views illustrating a method for forming a buried word line in accordance with a second embodiment of the present invention.

As shown in FIG. 3A, a pad oxide layer 43 and a pad nitride layer 44 are stacked over a substrate 41. Here, an impurity region 42 may be formed by implanting impurities through an ion implantation before forming the pad oxide layer 43. The impurity region 42 becomes a source region and a drain region of a transistor.

Subsequently, a shallow trench isolation (STI) process is performed. That is, the pad nitride layer 44 is etched using a photoresist layer as a device isolation mask (not shown). Then, the photoresist layer is removed, and the substrate 41 is etched with the pad nitride layer 44 acting as an etching barrier. Thus, a first trench 45 is formed using the pad nitride layer 44 as a hard mask. Then, a device isolation layer 48 is formed by gap-filling the first trench 45 with an insulating layer. The device isolation layer 48 may be formed using a flowable oxide layer through a single gap-fill process. Alternatively, the device isolation layer 48 may be formed using a combination of a flowable oxide layer and a deposition oxide layer. The flowable oxide layer may include Spin On Dielectric (SOD) and the deposition oxide layer may include HDP oxide.

Before forming the device isolation layer 48, a sidewall oxide layer 46 may be formed through a wall oxidation process and a liner nitride layer 47 may be formed on the sidewall oxide layer 46.

Figure 3B:
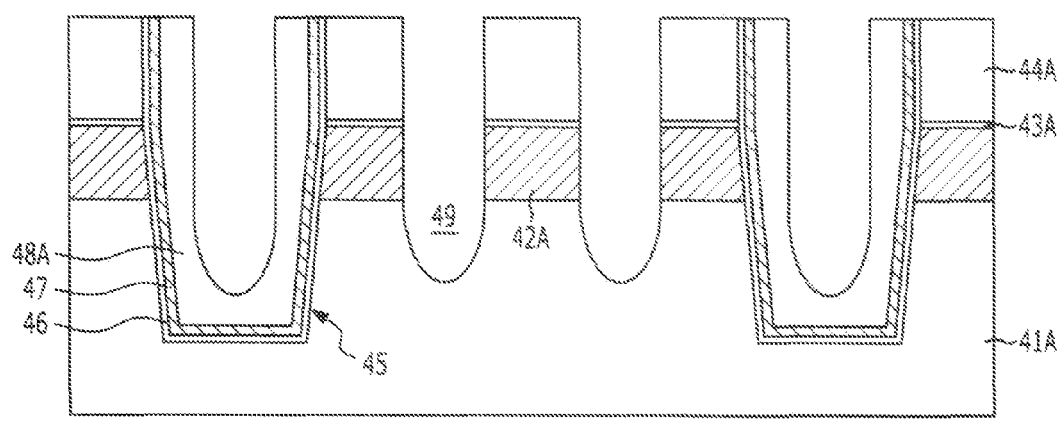

As shown in FIG. 3B, a second trench 49 is formed at a cell region by performing etching using a buried word line mask (not shown). That is, the second trench 49 is formed by continuously etching the substrate 41 and the device isolation layer 48 at a predetermined depth after etching the pad nitride layer 44 and the pad oxide layer 43. Hereinafter, the etched substrate is referred to as "a substrate 41A", the etched device isolation layer is referred to as "a device isolation layer 48A", the etched pad nitride layer is referred to as "a pad nitride layer 44A", and the etched pad oxide layer is referred to as "a pad oxide layer 43A". The second trench 49 isolates the impurity region to form a junction region 42A to be the source region and the drain region.

Figure 3C:
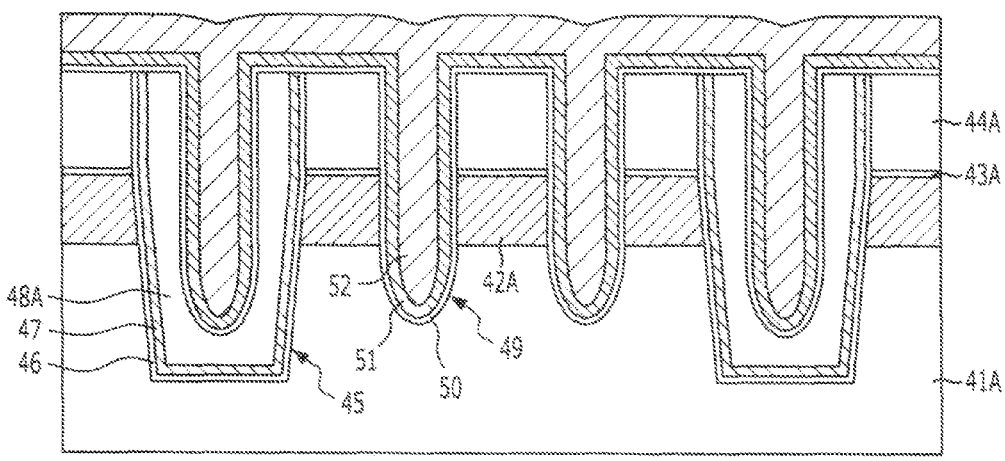

As shown in FIG. 3C, a gate insulating layer 50 is formed over the second trench 49. The gate insulating layer 50 is a gate insulating layer for a transistor in a cell region.

A metal layer is deposited over the gate insulating layer 50 to gap-fill the second trench 49. The metal layer may be formed by thinly depositing a titanium nitride layer 51 to conform to the second trench 49, and then gap-filling the second trench 49 with a tungsten layer 52. Preferably, the titanium nitride layer 51 may be formed at a thickness of about 20 Å to 80 Å.

The titanium nitride layer 51 is deposited using $TiCl_4$ or TDMAT $[Ti(N(CH_3)_2)_4]$ as a source gas. Due to the source gas $TiCl_4$ or TDMAT $[Ti(N(CH_3)_2)_4]$, the titanium nitride layer 51 includes a large amount of carbon or chlorine.

In order to form the tungsten (W) layer 52, $WF_6$ is used as a source gas. Accordingly, the tungsten layer 52 includes a large amount of fluorine.

Figure 3D:
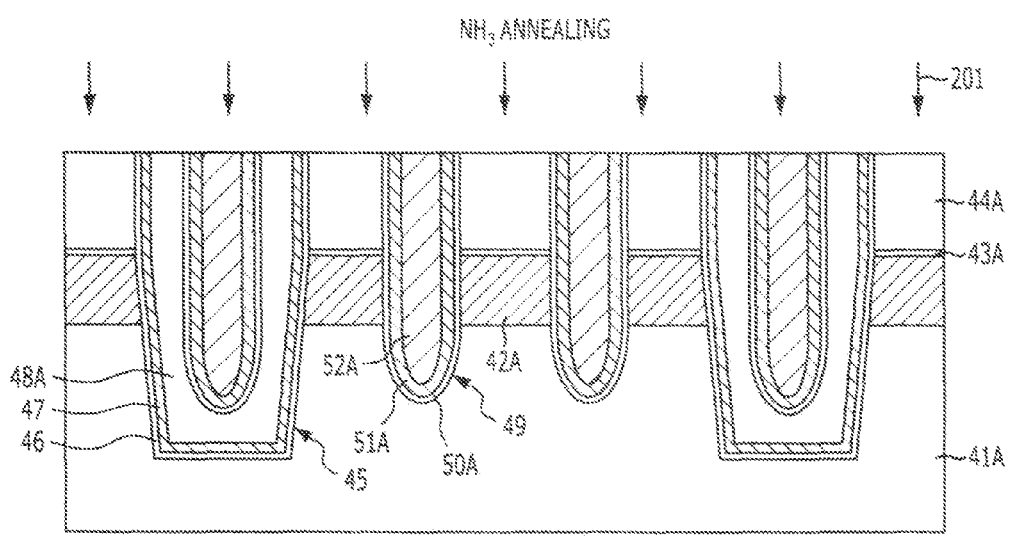

As shown in FIG. 3D, a planarization process is performed on the tungsten layer 52, the titanium nitride layer 51, and the gate insulating layer 50 using a chemical mechanical polishing (CMP) method to expose a surface of the pad nitride layer 44A. By this process, a tungsten layer 52A, a titanium nitride layer 51A, and a gate insulating layer 50A remain in the second trench 49.

In the second embodiment, in order to remove the carbon and chlorine components in the titanium nitride layer 51A and the fluorine components in the tungsten layer 52A, an annealing process 201 is performed in an $NH_3$ atmosphere.

Figure 3E:
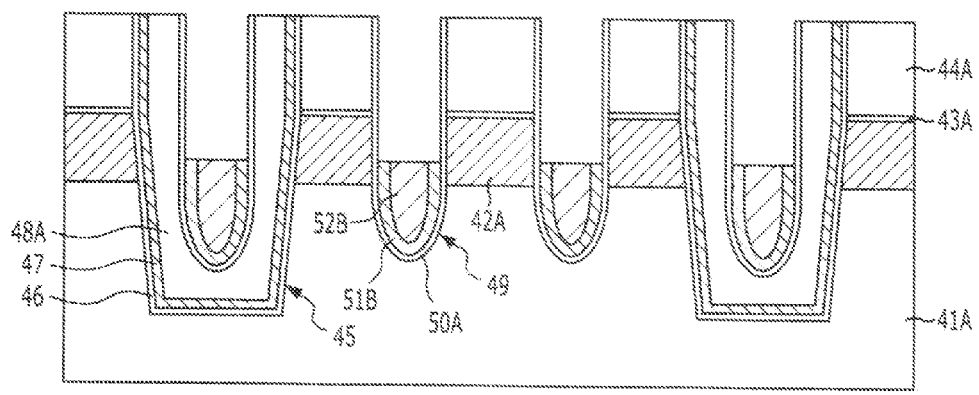

As shown in FIG. 3E, a buried word line is formed by performing an etch-back process to the tungsten layer 52A and the titanium nitride layer 51A. Thus, the buried word line only partially fills the second trench 49. The surface of the buried word line may be lower than a surface of the substrate 41A. The buried word line has a bi-layer structure of a titanium nitride layer 51B and a tungsten layer 52B.

Figure 3F:
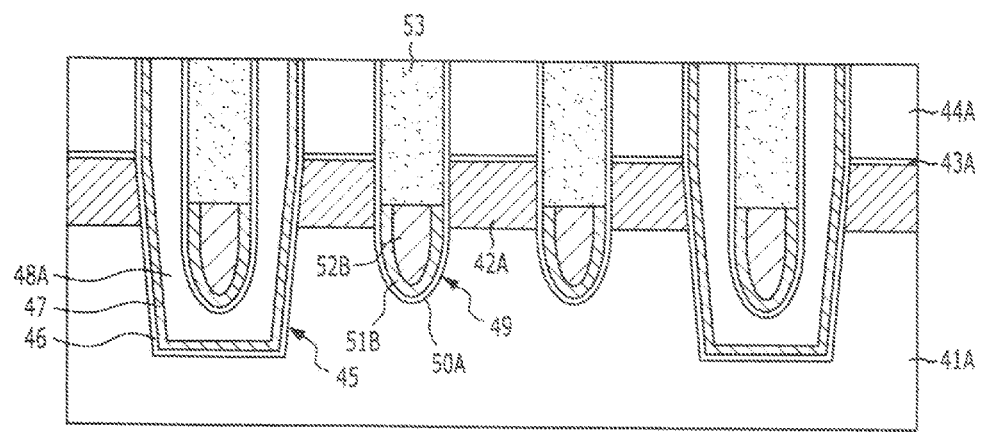

As shown in FIG. 3F, a sealing layer 53 is formed to seal a top of the buried word line. The sealing layer 53 may be one selected from a group consisting of an oxide layer, a nitride layer, and a bi-layer of a nitride layer and an oxide layer. For example, the sealing layer 53 may be formed by thinly depositing a sealing nitride layer and gap-filling the second trench 49 with a sealing oxide layer such as an SOD.

Then, a planarization process is performed on the sealing layer 53 to expose a surface of the pad nitride layer 44A. For example, a CMP or an etch-back may be performed to planarize the sealing layer 53. Preferably, a CMP is performed to improve wafer uniformity and to prevent loss in a lower layer.

FIGS. 4A to 4F are diagrams illustrating a method for forming a buried word line in accordance with a third embodiment of the present invention.

Figure 4A:
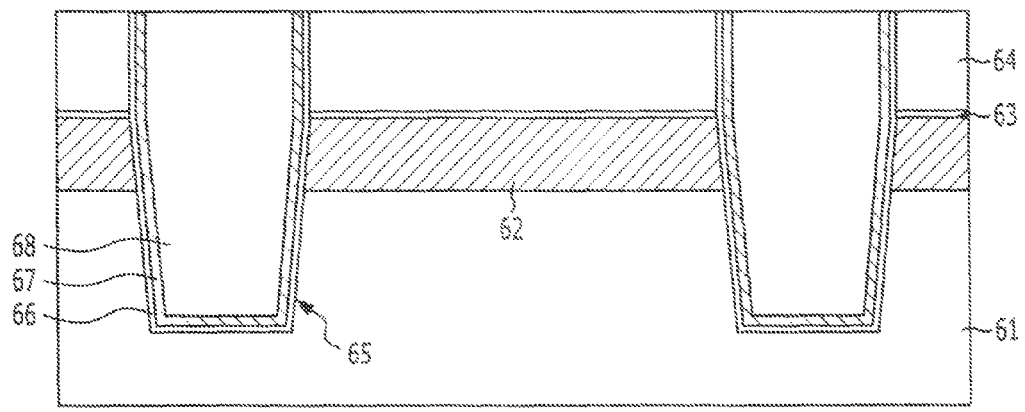
FIGS. 4A to 4F are cross-sectional views illustrating a method for forming a buried word line in accordance with a third embodiment of the present invention.

As shown in FIG. 4A, a pad oxide layer 63 and a pad nitride layer 64 are stacked over a substrate 61. The substrate 61 may be a silicon substrate. Here, an impurity region 62 may be formed by implanting impurities through an ion implantation before forming the pad oxide layer 63. The impurity region 62 becomes a source region and a drain region of a transistor.

Subsequently, a shallow trench isolation (STI) process is performed. That is, the pad nitride layer 64 is etched using a photoresist layer as a device isolation mask (not shown). Then, the photoresist layer is removed, and the substrate 61 is etched with the pad nitride layer 64 acting as an etching barrier. Thus, a first trench 65 is formed using the pad nitride layer 64 as a hard mask. Then, a device isolation layer 68 is formed by gap-filling the first trench 65 with an insulating layer. The device isolation layer 68 may be formed using a flowable oxide layer through a single gap-fill process. Alternatively, the device isolation layer 68 may be formed using a combination of a flowable oxide layer and a deposition oxide layer. The flowable oxide layer may include Spin On Dielectric (SOD) and the deposition oxide layer may include HDP oxide.

Before forming the device isolation layer 68, a sidewall oxide layer 66 may be formed through a wall oxidation process and a liner nitride layer 67 may be formed on the sidewall oxide layer 66.

Figure 4B:
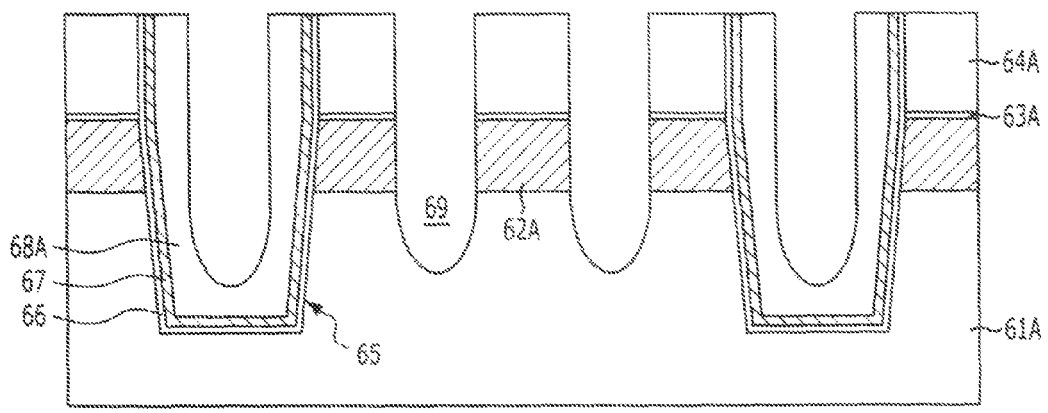

As shown in FIG. 4B, a second trench 69 is formed at a cell region by performing etching using a buried word line mask (not shown). That is, the second trench 69 is formed by continuously etching the substrate 61 and the device isolation layer 68 at a predetermined depth after etching the pad nitride layer 64 and the pad oxide layer 63. Hereinafter, the etched substrate is referred to as "a substrate 61A", the etched device isolation layer is referred to as "a device isolation layer 68A", the etched pad nitride layer is referred to as "a pad nitride layer 64A", and the etched pad oxide layer is referred to as "a pad oxide layer 63A". The second trench 69 isolates the impurity region to form a junction region 62A to be the source region and the drain region.

Figure 4C:
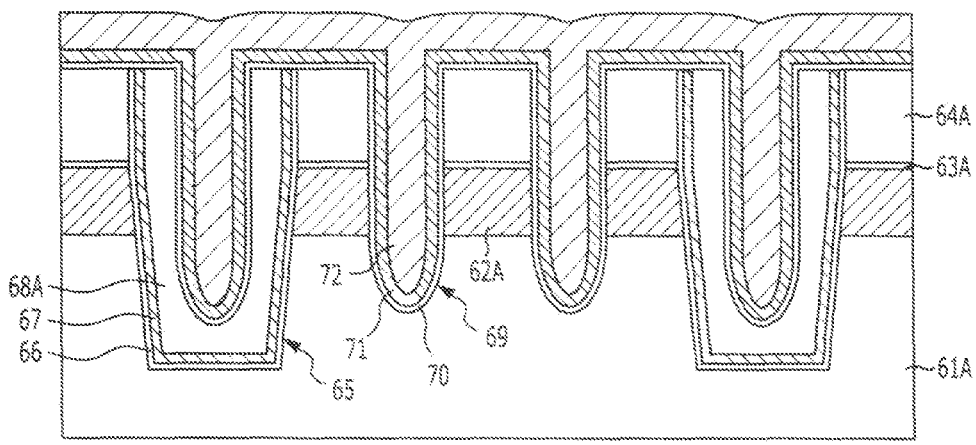

As shown in FIG. 4C, a gate insulating layer 70 is formed over the second trench 69. The gate insulating layer 70 is a gate insulating layer for a transistor in a cell region.

A metal layer is deposited over the gate insulating layer 70 to gap-fill the second trench 69. The metal layer may be formed by thinly depositing a titanium nitride layer 71 to conform to the second trench 69, and then gap-filling the second trench 69 with a tungsten layer 72. Preferably, the titanium nitride layer 71 may be formed at a thickness of about 20 Å to 80 Å.

The titanium nitride layer 71 is deposited using $TiCl_4$ or TDMAT $[Ti(N(CH_3)_2)_4]$ as a source gas. Due to the source gas $TiCl_4$ or TDMAT $[Ti(N(CH_3)_2)_4]$, the titanium nitride layer 71 includes a large amount of carbon or chlorine.

In order to form the tungsten (W) layer 72, $WF_6$ is used as a source gas. Accordingly, the tungsten layer 72 includes a large amount of fluorine.

Figure 4D:
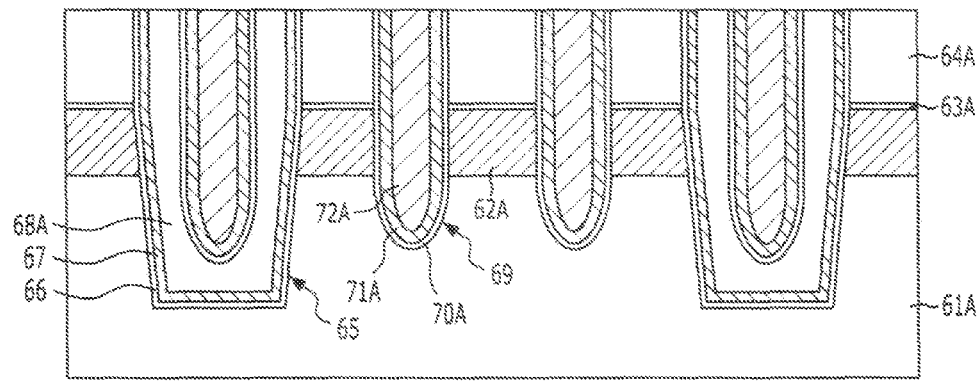

As shown in FIG. 4D, a planarization process is performed on the tungsten layer 72, the titanium nitride layer 71, and the gate insulating layer 70 using a chemical mechanical polishing (CMP) method to expose a surface of the pad nitride layer 64A. By this process, a tungsten layer 72A, a titanium nitride layer 71A, and a gate insulating layer 70A remain in the second trench 69.

Figure 4E:
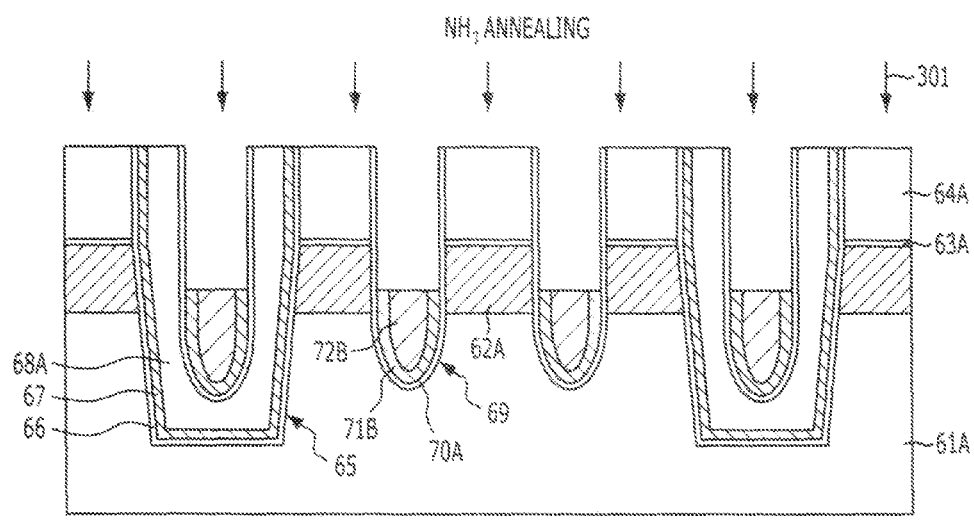

As shown in FIG. 4E, a buried word line is formed by performing an etch-back process to the tungsten layer 72A and the titanium nitride layer 71A. Thus, the buried word line only partially fills the second trench 69. The surface of the buried word line may be lower than a surface of the substrate 61A. The buried word line has a bi-layer structure of a titanium nitride layer 71B and a tungsten layer 72B.

In the third embodiment of the present invention, in order to remove the carbon and chlorine components in the titanium nitride layer 71B and the fluorine components in the tungsten layer 72B, an annealing process 301 is performed in an $NH_3$ atmosphere.

Figure 4F:
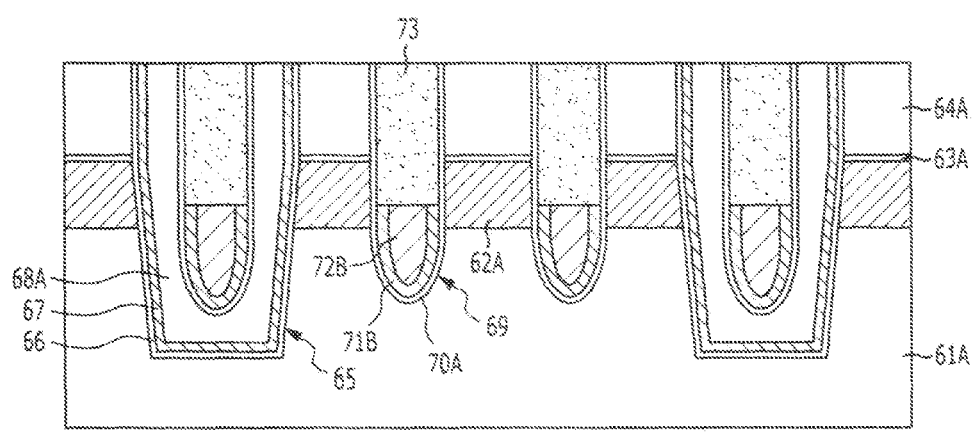

As shown in FIG. 4F, a sealing layer 73 is formed to seal a top of the buried word line. The sealing layer 73 may be one selected from a group consisting of an oxide layer, a nitride layer, and a bi-layer of a nitride layer and an oxide layer. For example, the sealing layer 73 may be formed by thinly depositing a sealing nitride layer and gap-filling the second trench 69 with a sealing oxide layer such as an SOD.

Then, a planarization process is performed on the sealing layer 73 to expose a surface of the pad nitride layer 64A. For example, a CMP or an etch-back may be performed to planarize the sealing layer 73. Preferably, a CMP is performed to improve wafer uniformity and to prevent loss in a lower layer.

FIGS. 5A to 5F are diagrams illustrating a method for forming a buried word line in accordance with a fourth embodiment of the present invention.

Figure 5A:
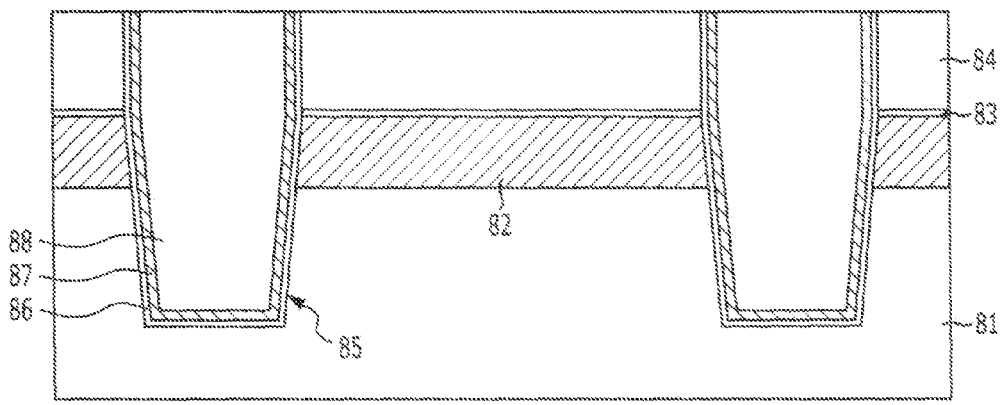
FIGS. 5A to 5F are cross-sectional views illustrating a method for forming a buried word line in accordance with a fourth embodiment of the present invention.

As shown in FIG. 5A, a pad oxide layer 83 and a pad nitride layer 84 are stacked over a substrate 81. The substrate 81 may be a silicon substrate. Here, an impurity region 82 may be formed by implanting impurities through an ion implantation before forming the pad oxide layer 83. The impurity region 82 becomes a source region and a drain region of a transistor.

Subsequently, a shallow trench isolation (STI) process is performed. That is, the pad nitride layer 84 is etched using a photoresist layer as a device isolation mask (not shown). Then, the photoresist layer is removed, and the substrate 81 is etched with the pad nitride layer 84 acting as an etching barrier. Thus, a first trench 85 is formed using the pad nitride layer 84 as a hard mask. Then, a device isolation layer 88 is formed by gap-filling the first trench 85 with an insulating layer. The device isolation layer 88 may be formed using a flowable oxide layer through a single gap-fill process. Alternatively, the device isolation layer 88 may be formed using a combination of a flowable oxide layer and a deposition oxide layer. The flowable oxide layer may include Spin On Dielectric (SOD) and the deposition oxide layer may include HDP oxide.

Before forming the device isolation layer 88, a sidewall oxide layer 86 may be formed through a wall oxidation process and a liner nitride layer 87 may be formed on the sidewall oxide layer 86.

Figure 5B:
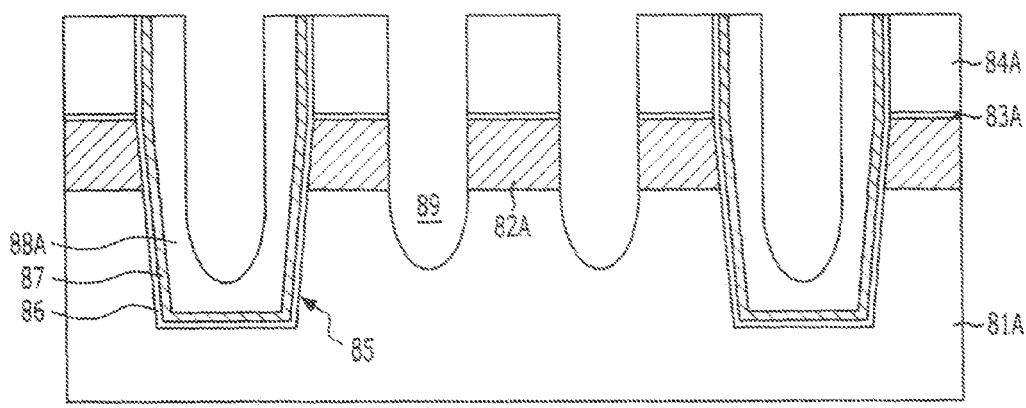

As shown in FIG. 5B, a second trench 89 is formed at a cell region by performing etching using a buried word line mask (not shown). That is, the second trench 89 is formed by continuously etching the substrate 81 and the device isolation layer 88 at a predetermined depth after etching the pad nitride layer 84 and the pad oxide layer 83. Hereinafter, the etched substrate is referred to as "a substrate 81A", the etched device isolation layer is referred to as "a device isolation layer 88A", the etched pad nitride layer is referred to as "a pad nitride layer 84A", and the etched pad oxide layer is referred to as "a pad oxide layer 83A". The second trench 89 isolates the impurity region to form a junction region 82A to be the source region and the drain region.

Figure 5C:
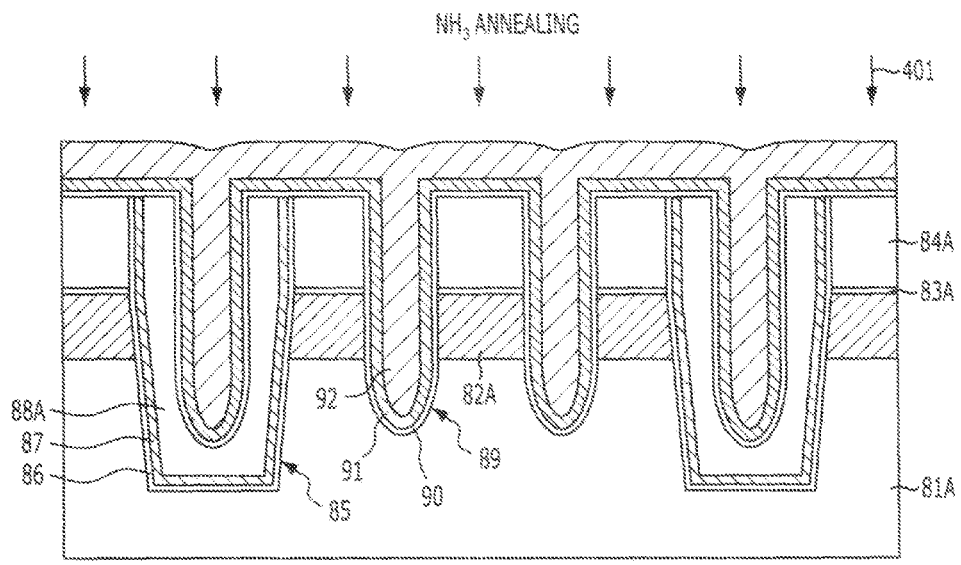

As shown in FIG. 5C, a gate insulating layer 90 is formed over the second trench 89. The gate insulating layer 90 is a gate insulating layer for a transistor in a cell region.

A metal layer is deposited over the gate insulating layer 90 to gap-fill the second trench 89. The metal layer may be formed by thinly depositing a titanium nitride layer 91 to conform to the second trench 89, and then gap-filling the second trench 89 with a tungsten layer 92. Preferably, the titanium nitride layer 91 may be formed at a thickness of about 20 Å to 80 Å.

The titanium nitride layer 91 is deposited using $TiCl_4$ or TDMAT $[Ti(N(CH_3)_2)_4]$ as a source gas. Due to the source gas $TiCl_4$ or TDMAT $[Ti(N(CH_3)_2)_4]$, the titanium nitride layer 91 includes a large amount of carbon or chlorine.

In order to form the tungsten (W) layer 92, $WF_5$ is used as a source gas. Accordingly, the tungsten layer 92 includes a large amount of fluorine.

In order to remove the carbon and chlorine components in the titanium nitride layer 91 and the fluorine components in the tungsten layer 92, a first $NH_3$ annealing process 401 is performed.

Figure 5D:
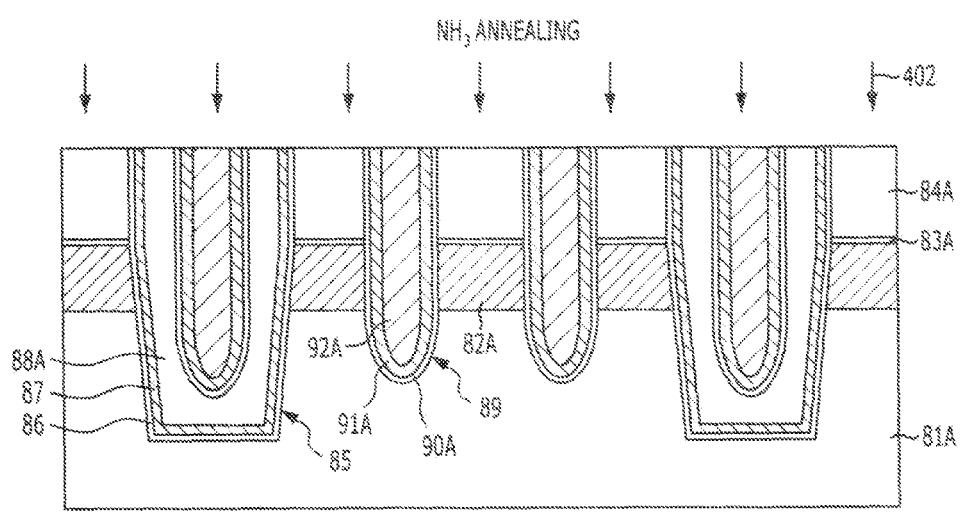

As shown in FIG. 5D, a planarization process is performed on the tungsten layer 92, the titanium nitride layer 91, and the gate insulating layer 90 using a chemical mechanical polishing (CMP) method to expose a surface of the pad nitride layer 84. By this process, a tungsten layer 92A, a titanium nitride layer 91A, and a gate insulating layer 90A remain in the second trench 89.

After the planarization process of the gate insulating layer 90, the titanium nitride layer 91, and the tungsten layer 92, a second $NH_3$ annealing process 402 is performed to remove the carbon and chlorine components in the titanium nitride layer 91A and the fluorine components in the tungsten layer 92A.

Figure 5E:
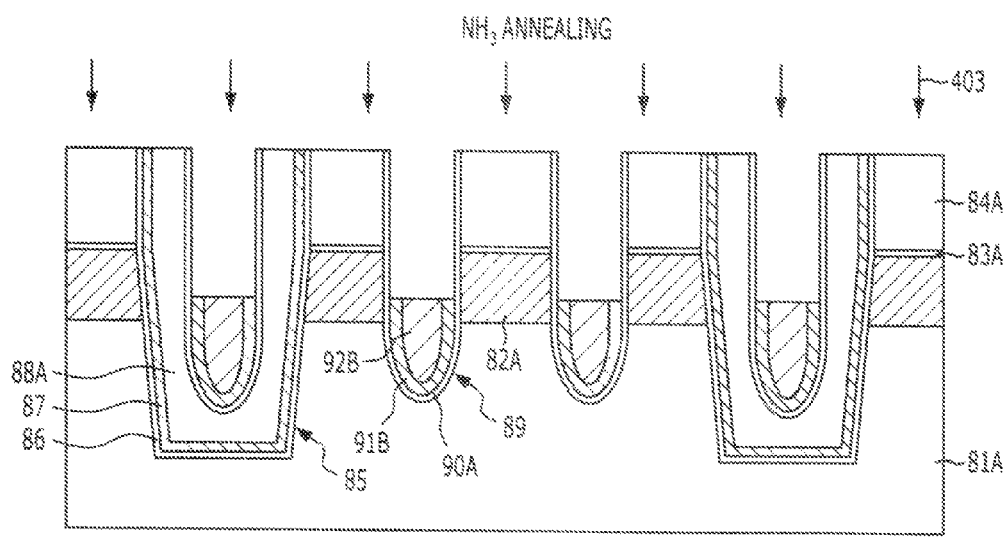

As shown in FIG. 5E, a buried word line is formed by performing an etch-back process to the titanium nitride layer 91A and the tungsten layer 92A. Thus, the buried word line only partially fills the second trench 89. The surface of the buried word line may be lower than a surface of the substrate 81A. The buried word line has a bi-layer structure of a titanium nitride layer 91B and a tungsten layer 92B.

After the etch-back process to the titanium nitride layer 91A and the tungsten layer 92A, a third $NH_3$ annealing process 403 is performed to remove the carbon and chlorine components in the titanium nitride layer 91B and the fluorine components in the tungsten layer 92B.

Figure 5F:
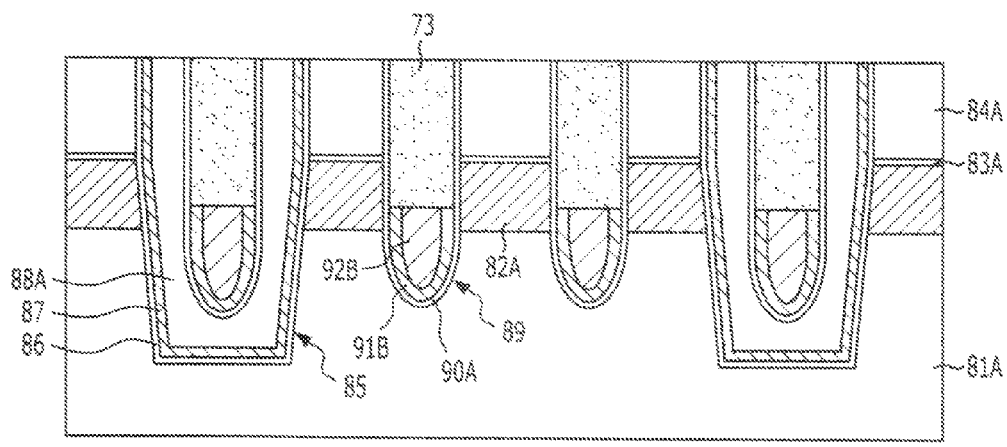

As shown in FIG. 5F, a sealing layer 93 is formed to seal a top of the buried word line. The sealing layer 93 may be one selected from a group consisting of an oxide layer, a nitride layer, and a bi-layer of a nitride layer and an oxide layer. For example, the sealing layer 93 may be formed by thinly depositing a sealing nitride layer and gap-filling the second trench 89 with a sealing oxide layer such as an SOD.

Then, a planarization process is performed on the sealing layer 93 to expose a surface of the pad nitride layer 84A. For example, a CMP or an etch-back may be performed to planarize the sealing layer 93. Preferably, a CMP is performed to improve wafer uniformity and to prevent loss in a lower layer.

As described above, in the fourth embodiment, the $NH_3$ annealing processes are performed after the deposition of the titanium nitride layer 91 and the tungsten layer 92, after the planarization of the titanium nitride layer 91 and the tungsten layer 92, and after the etch-back of the titanium nitride layer 91A and the tungsten layer 92A in order to remove the carbon and chlorine components in the titanium nitride layer 91 and the fluorine components in the tungsten layer 92. Accordingly, it is possible to further reduce the sheet resistance of the buried word line compared with the first, second, and third embodiments by minimizing the remaining impurities.

The $NH_3$ annealing process performed in the embodiments of the present invention may be a rapid thermal process (RTP) or a furnace type process. The $NH_3$ annealing process may be performed at a temperature in a range of 300° C. to 1100° C. The $NH_3$ annealing process may be performed at a pressure in a range of 0.001 torr to 1000 torr. The $NH_3$ annealing process may be performed for a duration in a range of 1 second to 10000 seconds. Here, the resistivity of a material used as a buried word line is reduced as the annealing temperature increases. Further, the resistivity of a material used as a buried word line is reduced as the annealing process pressure decreases. As a result, the resistivity may be reduced up to about 30%. Further, the annealing process may only be performed in an atmosphere including a nitride-based gas, such as $NH_3$ gas. However, the annealing process may be performed in an $NH_3$ gas atmosphere mixed with inert gases, such as Ar, He, and $N_2$.

As a result, the sheet resistance Rs of the buried word line is reduced by performing the $NH_3$ annealing process on the titanium nitride layer and the tungsten layer.

Since the resistivity is reduced through the $NH_3$ annealing process, a single layer of the titanium nitride layer may be used as the buried word line. Further, it is possible to suppress the increase of sheet resistance, although an etch-back depth is increased during the etch-back process, in order to improve the refresh property of the device.

As described above, the sheet resistance of the buried word line can be reduced by removing impurity components in the titanium nitride layer and the tungsten layer of the buried word line through performing the annealing process in the $NH_3$ atmosphere.

Since the resistivity is reduced through the $NH_3$ annealing process, a single layer of the titanium nitride layer may be used as the buried word line.

Further, the refresh property can be improved because it is possible to suppress the increase of sheet resistance although an etch-back depth is increased during the etch-back process.

While the present invention has been described with respect to the specific embodiments, it will be apparent to those skilled in the art that various changes and modifications may be made without departing from the spirit and scope of the invention as defined in the following claims.

What is claimed is:

1. A method for forming a buried word line in a semiconductor device, comprising:
   forming a trench by etching a pad layer and a substrate;
   forming a conductive layer to fill the trench;
   planarizing the conductive layer until the pad layer is exposed;
   performing an etch-back process on the planarized conductive layer; and
   performing an annealing process in an atmosphere of a nitride-based gas after the forming of the conductive layer, after the planarizing of the conductive layer, and after the performing of the etch-back process on the planarized conductive layer.

2. The method of claim 1, wherein in the performing of the annealing process, the nitride gas comprises a $NH_3$ gas.

3. The method of claim 2, wherein in the performing of the annealing process, the annealing process is performed in an inert gas mixed with the $NH_3$ gas.

4. The method of claim 3, wherein the inert gas comprises one of Ar, He, and $N_2$.

5. The method of claim 1, wherein in the performing of the annealing process, the annealing process is a rapid thermal process (RTP) or a furnace type process.

6. The method of claim 1, wherein in the performing of the annealing process, the annealing process is performed in a temperature range of about 300°C. to 1100 °C. at a process pressure range of about 0.001 torr to 1000 torr for a duration of about 1 second to 10000 seconds.

7. The method of claim 1, wherein the conductive layer is a single layer of a titanium nitride layer or a bi-layer of a titanium nitride layer and a tungsten layer.

* * * * *